(12) United States Patent  
Kawano et al.

(10) Patent No.: US 8,043,730 B2
(45) Date of Patent: Oct. 25, 2011

(54) PART FOR ROTARY MACHINE, AND MANUFACTURING METHOD THEREFOR

(75) Inventors: Masaki Kawano, Hiroshima (JP); Toyoaki Yasui, Hiroshima (JP); Yuya Konno, Hiroshima (JP); Kyoichi Ikeno, Hiroshima (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 118 days.

(21) Appl. No.: 12/320,474

(22) Filed: Jan. 27, 2009

(65) Prior Publication Data

US 2010/0034660 A1  Feb. 11, 2010

(30) Foreign Application Priority Data

Aug. 7, 2008 (JP) .................. 2008-204180

(51) Int. Cl.
*B32B 9/00* (2006.01)

(52) U.S. Cl. ........ 428/698; 428/216; 428/336; 428/469; 428/472

(58) Field of Classification Search .................. 428/216, 428/336, 469, 472, 698
See application file for complete search history.

(56) References Cited

U.S. PATENT DOCUMENTS

| | | | | |
|---|---|---|---|---|
| 4,835,062 A | * | 5/1989 | Holleck | 428/698 |
| 5,700,551 A | * | 12/1997 | Kukino et al. | 428/698 |
| 6,060,182 A | * | 5/2000 | Tanaka et al. | 428/698 |
| 6,372,369 B1 | * | 4/2002 | Ito et al. | 428/698 |
| 6,620,491 B2 | * | 9/2003 | Kukino et al. | 428/336 |
| 7,033,643 B2 | | 4/2006 | Sugita et al. | |

FOREIGN PATENT DOCUMENTS

| | | |
|---|---|---|
| JP | 56-25960 | 3/1981 |
| JP | 63-129102 | 6/1988 |
| JP | 8-30264 | 3/1996 |
| JP | 3633837 | 11/2000 |
| JP | 2005-001088 | 1/2005 |
| JP | 3633837 | 3/2005 |
| JP | 2006-037212 | 2/2006 |
| JP | 2006-116633 | 5/2006 |
| JP | 2007-162613 | 6/2007 |

OTHER PUBLICATIONS

European Search Report dated Aug. 6, 2009 for European Application No. 09151593.2.
Japanese Office Action issued Feb. 1, 2011 in corresponding Japanese Patent Application No. 2009-013593 w/English translation.

* cited by examiner

*Primary Examiner* — Archene Turner
(74) *Attorney, Agent, or Firm* — Wenderoth, Lind & Ponack, L.L.P.

(57) ABSTRACT

In a part for a rotary machine, a ceramic hard film is formed on a surface of a base material, the density of droplets which exist in a surface of the ceramic hard film is set to be within 1000 pieces/mm$^2$, and the density of droplets whose mean particle diameter is 1 μm or less is set to be within 550 pieces/mm$^2$. A method for manufacturing the part of a rotary machine is a method for forming the ceramic hard film by at least an ion plating method or a sputtering method.

9 Claims, 12 Drawing Sheets

FIG. 11A
FIG. 11B
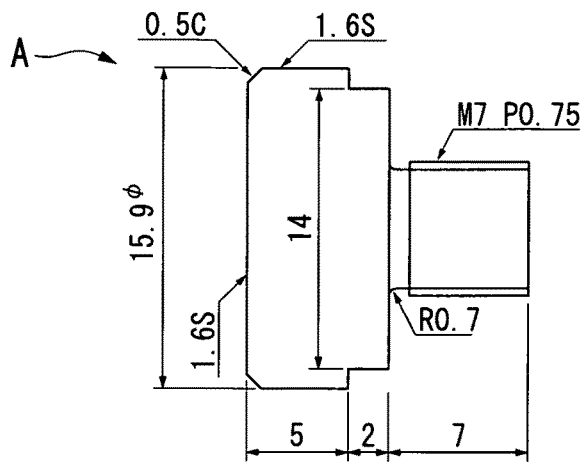
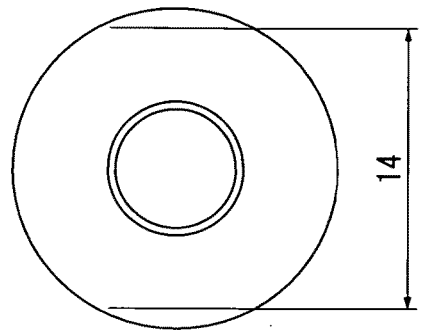
FIG. 11C
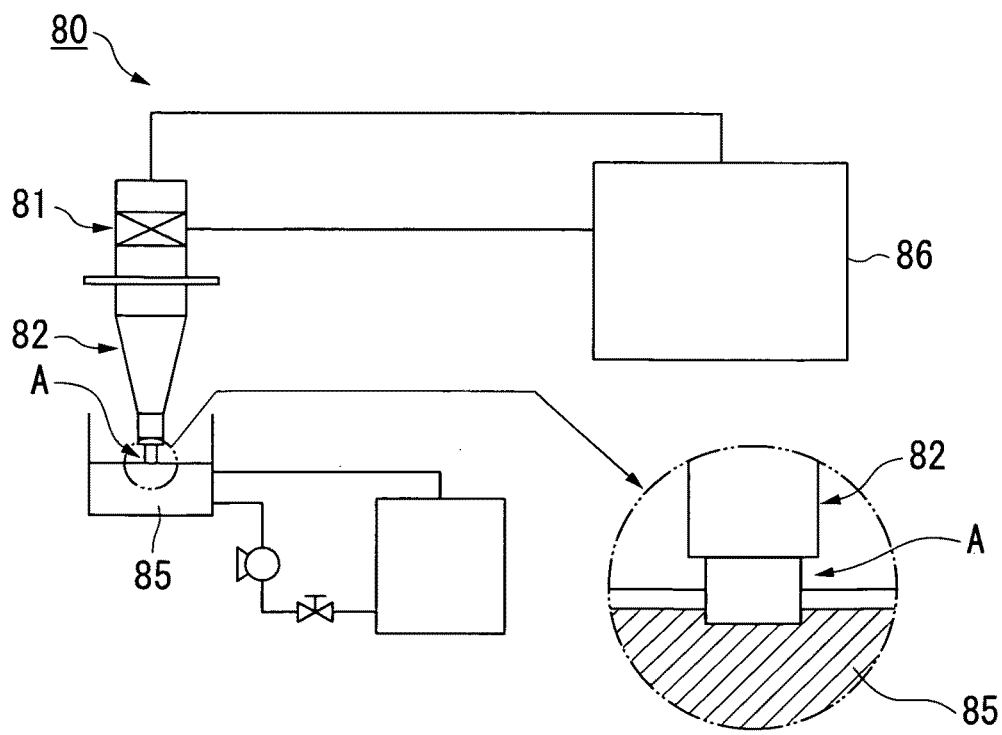

US 8,043,730 B2

PART FOR ROTARY MACHINE, AND MANUFACTURING METHOD THEREFOR

BACKGROUND OF THE INVENTION

1. Field of the Invention

The present invention relates to a part for a rotary machine, and manufacturing method therefor.

Priority is claimed on Japanese Patent Application No. 2008-204180, filed on Aug. 7, 2008, the content of which is incorporated herein by reference.

2. Description of Related Art

Conventionally, for example, in parts, such as a blade used for a rotary machine, such as a steam turbine or a compressor pump, surface treatment is performed in consideration of thermal resistance, erosion resistance, etc. The steam turbine jets steam, which is a working fluid, toward the moving blade of a turbine to drive the blade. Parts of a rotary machine, such as a moving blade (steam turbine blade) or a rotor of this steam turbine, contact steam directly. Additionally, the compressor (compressor pump) which is used in a chemical plant or the like and compresses various fluids receives power from the outside to rotate an impeller and compress a fluid. Even in such a compressor pump, parts of a rotary machine, such as an impeller or a rotor, contact gas directly.

Here, in parts against which water droplets collide at high speed, for example, in the blade of the steam turbine or the impeller of the compressor pump, there is a problem in that erosion abrasion occurs on the surfaces of the parts against which water droplets collide. As a measure against this problem, for example, a technique of performing cladding of stellite on the impeller is known. Additionally, a technique of forming a hard film on the surface of the impeller is known using a physical vapor deposition (PVD) method, such as ion plating.

However, with the technique of stellite cladding as described above, since a base material is melted, there is a problem in that deformation of the base material becomes greater than with other methods. Additionally, with the technique of stellite cladding, hardness is low compared with ceramic coating or the like. Thus, when stellite is not formed as a thick film in the order of several millimeters, there is a problem in that it is difficult to produce the effect of protecting the base material from erosion abrasion.

Meanwhile, as a method of coating a base material with a hard film by the ion plating method to improve erosion-proofness, for example, as shown in FIGS. 13 and 14, a technique of forming a Cr film 101 on a base material 100 made of stainless steel, and coating a TiN film 102 on the surface of the Cr film 101 to form a multilayer is suggested (refer to Japanese Patent Publication No. 8-30264). However, when such a method is used, particulate scaffolding called droplets (refer to reference numeral 110 in FIG. 14) as shown in a microscope picture diagram of FIG. 14 exists in the surface of the coating layer 102. If the size of the droplets is large and the number of the droplets is large, there is a problem in that the erosion abrasion (drain erosion) by the water droplets increases.

A mechanism where droplets are missing from the surface of a hard film of a conventional steam turbine blade will be described below with reference to schematic diagrams of FIGS. 15A to 15C. As shown in FIG. 15A, a drain (water droplets) 250 which forms steam has a diameter of about 100 to 200 μm, and collides against the hard film 210 provided in the surface of a steam turbine blade. In this case, the drain 250, as shown in FIG. 15B, also collides with droplets 220 which exist on the surface of the hard film 210. The droplets 220 may be missing from the hard film 210 due to the collision of the drain 250. As shown in FIG. 15C, portions where the droplets 220 are missing become recesses 230 in the surface of the hard film 210. Cavitation erosion is increased with the recesses 230 as a starting point. In this case, if the density of the droplets 220 is high, there is a problem in that cavitation erosion may be further increased. Furthermore, even when a portion of a missing droplet 220 remains inside a recess 230, a problem that the same cavitation erosion is increased occurs.

Additionally, forming a film on the surface of a cutting tool by a sputtering method is suggested in the field of cutting tools, such as a ball end mill. Specifically, it is suggested that micro-particles (droplets), which exist on the surface of a cutting tool, having a maximum diameter of 10 μm or less, and an occupying area ratio of 10% or less on the surface, form a film (refer to Japanese Patent Unexamined Publication No. 2006-116633). However, even if the film described in Japanese Patent Unexamined Publication No. 2006-116633 is applied to parts for a rotary machine, such as a steam turbine blade, there is a problem in that the droplets are easily missing. This is because, when droplets having a maximum diameter of 10 μm compared to water droplets (steam) whose diameter is 100 to 200 μm exist on the surface of a film, droplets are easily missing due to the stress concentration at the boundary of the film. Additionally, the area occupied by the droplets in this film surface is relatively large. Accordingly, when droplets are missing and drain erosion occurs, there is a concern that drain erosion may be increased by the interaction between droplet missing spots.

Additionally, a technique of removing droplets formed in a film surface by methods, such as polishing, in advance is also suggested (refer to Japanese Patent Unexamined Publication No. 2005-1088). However, a spot where a droplet is removed in the film surface degrades erosion-proofness. Therefore, with this technique, there is a problem in that erosion is increased with this position as a starting point.

Generally, in order to reduce the particle diameter of droplets and to decrease the number of the droplets, it is necessary to reduce the deposition rate of a film and also to reduce film thickness. However, in order to improve drain erosion-proofness by the hard film, a film thickness of about several micrometers to tens of micrometers is required. When the hard film is formed thickly in this way, the particle diameter and number of droplets also increase according to a thickness. Accordingly, it was difficult to apply a hard film to be used for general cutting tools or the like to, for example, parts for a rotary machine, such as a steam turbine blade, as a drain erosion-proofness coating.

The invention has been made in view of the above problems, and an object thereof is to provide a part for a rotary machine and its manufacturing method, which are excellent in drain erosion-proofness under an environment in which the part for a rotary machine contacts steam directly.

SUMMARY OF THE INVENTION

In order to solve the above problems, the invention has adopted the following configurations.

That is, in a part for a rotary machine related to the invention, at least a ceramic hard film is formed on a surface of a base material, the density of droplets which exist in a surface of the ceramic hard film is set to be within 1000 pieces/mm$^2$, and the density of droplets whose mean particle diameter is 1 μm or less is set to be within 550 pieces/mm$^2$.

According to the part for a rotary machine of the above configuration, the density of the droplets which exist in the surface of the ceramic hard film is set to be within 1000 pieces/mm$^2$, and the density of the droplet whose mean particle diameter is 1 μm or less is set to be within 550 pieces/mm$^2$. Thereby, generation of starting points of drain erosion decreases, and erosion-proofness can be improved.

Additionally, in the part for a rotary machine related to the invention, the ceramic hard film is made of at least one or more kinds of TiN, CrN, TiAlN, TiC, TiCN, and ZrN.

According to the part for a rotary machine of the above configuration, wear resistance and drain erosion-proofness can be improved by making the ceramic hard film of the above substances.

Additionally, in the part for a rotary machine related to the invention, an interlayer is formed between the base material and the ceramic hard film.

According to the part for a rotary machine of the above configuration, the interlayer relaxes the internal stress generated in the ceramic hard film, and improves the adhesion between the ceramic hard film and the base material.

Additionally, in the part for a rotary machine related to the invention, the interlayer contains Cr or Ti.

Additionally, in the part for a rotary machine related to the invention, the interlayer contains CrN or TiN.

According to the part for a rotary machine of the above configuration, the internal stress generated in the ceramic hard film is effectively relaxed, and the adhesion between the ceramic hard film and the base material is further improved.

Additionally, in the part for a rotary machine related to the invention, the film thickness of the ceramic hard film is preferably within a range of 5 μM or more and 15 μm or less.

Additionally, in the part for a rotary machine related to the invention, the film thickness of the ceramic hard film is greater than the film thickness of the interlayer, and the total film thickness of the ceramic hard film and the interlayer is preferably within a range of 5 μm or more and 20 μm or less.

According to the part for a rotary machine of the above configuration, wear resistance and drain erosion-proofness can be improved by setting the film thickness of each film to the above range.

The method for manufacturing a part of a rotary machine related to the invention is a method for forming the part for a rotary machine of the above configuration, and is a method for forming the ceramic hard film on the surface of the base material by at least an ion plating method or a sputtering method.

According to the method for manufacturing the part for a rotary machine of the above configuration, the particle diameter and density of droplets which exist on the surface of the ceramic hard film can be reduced by forming the ceramic hard film on the base material under the above conditions.

According to the part for a rotary machine of the invention, by the respective configurations listed above, the drain erosion-proofness under an environment where the part for a rotary machine directly contacts steam is improved, and the part for a rotary machine which is inexpensive and has a long life cycle can be realized.

According to the method for manufacturing the part for a rotary machine of the invention, a part for a rotary machine which is excellent in drain erosion-proofness, is inexpensive, and is long in life can be manufactured with high production efficiency by adopting the above method.

BRIEF DESCRIPTION OF THE DRAWINGS

FIG. 11A is a schematic diagram illustrating a working example of the part for a rotary machine related to the invention, and is a side view of a test piece A used for a cavitation erosion test to be used for drain erosion-proofness evaluation;

FIG. 11B is a schematic diagram illustrating the working example of the part for a rotary machine related to the invention, and is a front view of the test piece A used for the cavitation erosion test to be used for drain erosion-proofness evaluation;

FIG. 11C is a schematic diagram illustrating the working example of the part for a rotary machine related to the invention, and is a schematic diagram of a cavitation erosion testing device used for the cavitation erosion test to be used for drain erosion-proofness evaluation;

DETAILED DESCRIPTION OF THE INVENTION

Figure 1:
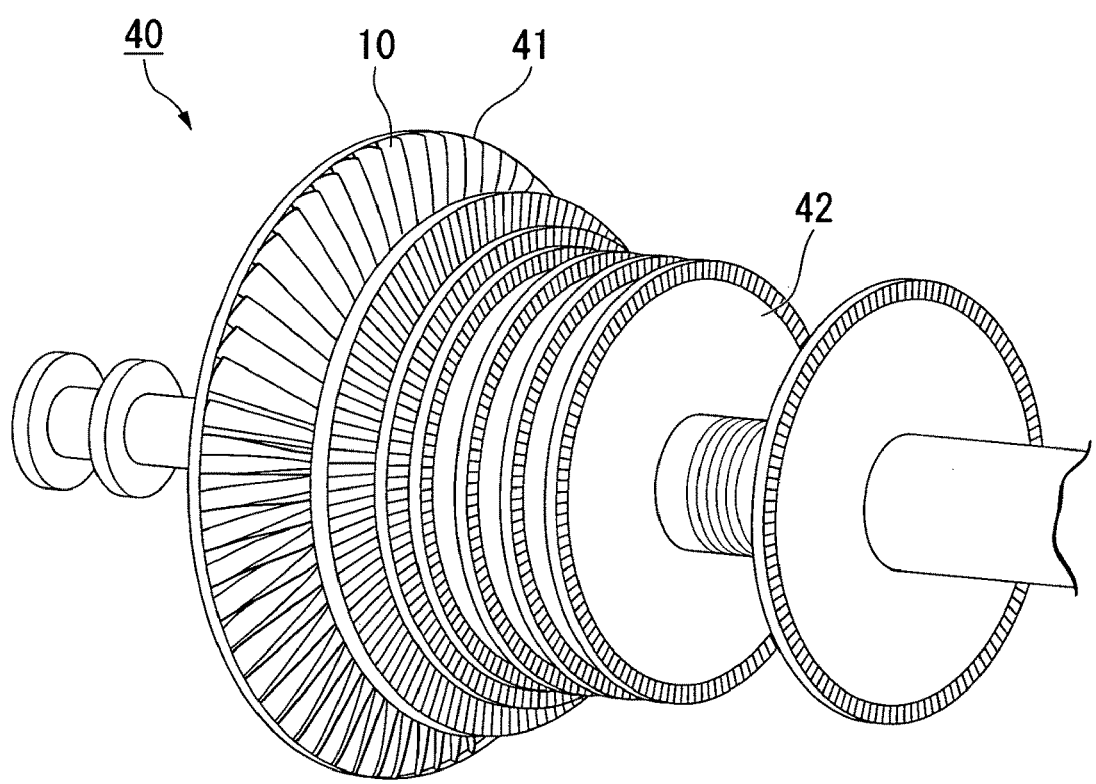
FIG. 1 is a perspective view schematically illustrating a steam turbine blade that is an example of a part for a rotary machine related to the invention, and is a schematic diagram showing a steam turbine for which the steam turbine blade is to be used.

Hereinafter, a part for a rotary machine related to the invention and its manufacturing method will be described taking a steam turbine blade as an example suitably referring to the drawings.

Figure 2:
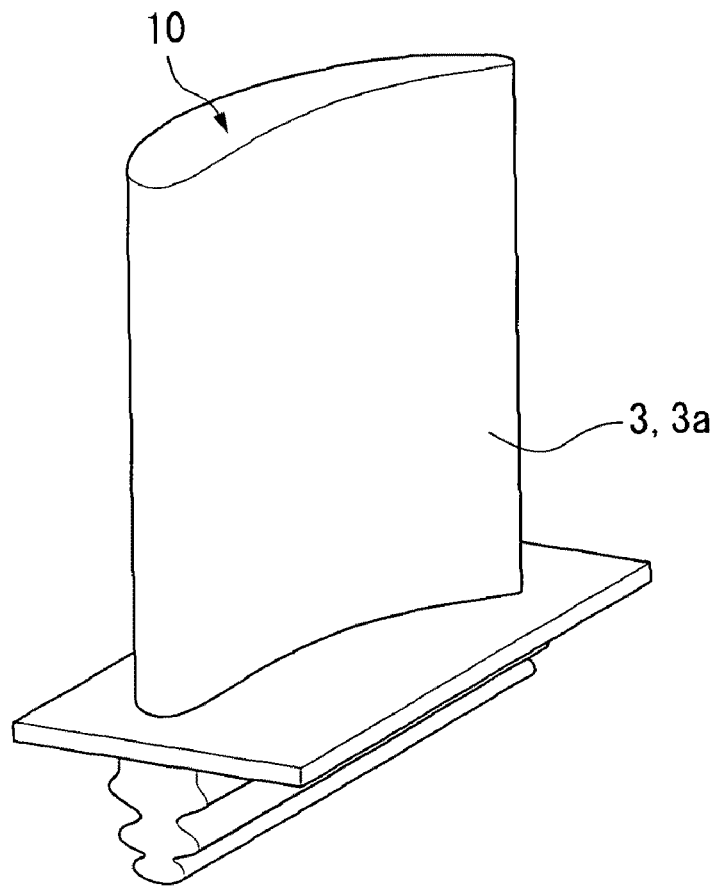
FIG. 2 is a perspective view schematically illustrating a first embodiment of the steam turbine blade related to the invention.
Figure 3:
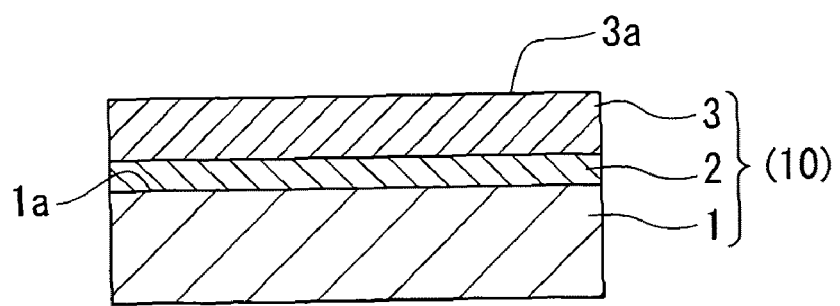
FIG. 3 is a view illustrating the first embodiment of the steam turbine blade related to the invention, and is a schematic sectional view showing a structure where an interlayer and a ceramic hard film are laminated sequentially on a base material.
Figure 4A:
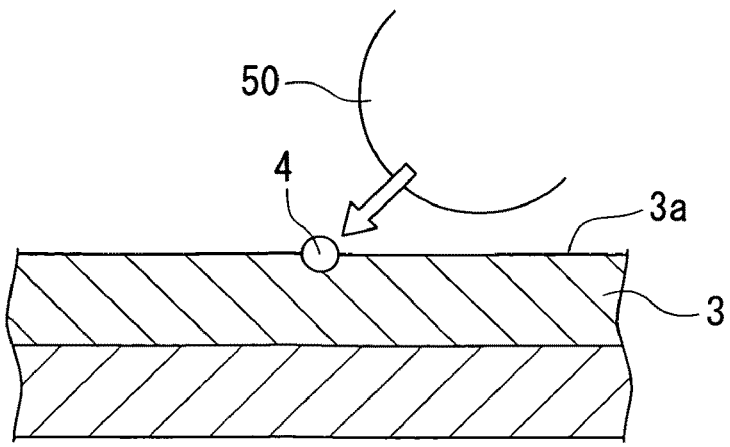
FIG. 4A is a view schematically illustrating an example of the steam turbine blade related to the invention, and is a sectional view showing a state where a drain collides against the surface of the ceramic hard film.
Figure 4B:
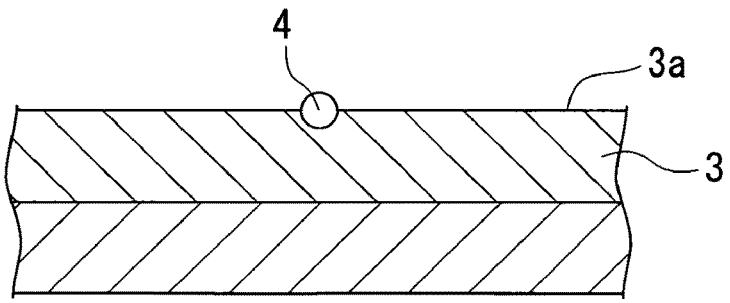
FIG. 4B is a view schematically illustrating the example of the steam turbine blade related to the invention, and is a sectional view showing a state where droplets have remained in the surface of the ceramic hard film without missing.
Figure 4C:
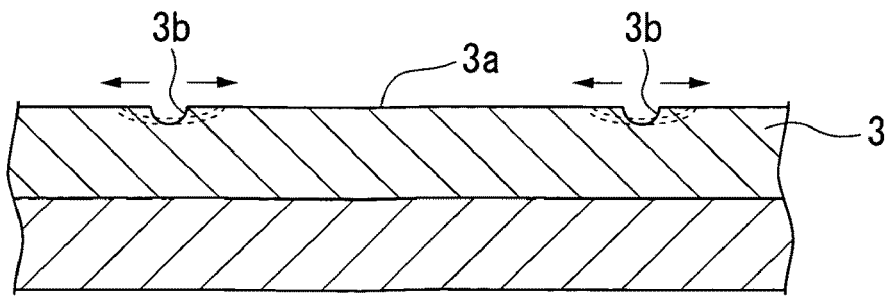
FIG. 4C is a view schematically illustrating the example of the steam turbine blade related to the invention, and is a sectional view showing a state where droplets are missing in the surface of the ceramic hard film.
Figure 5:
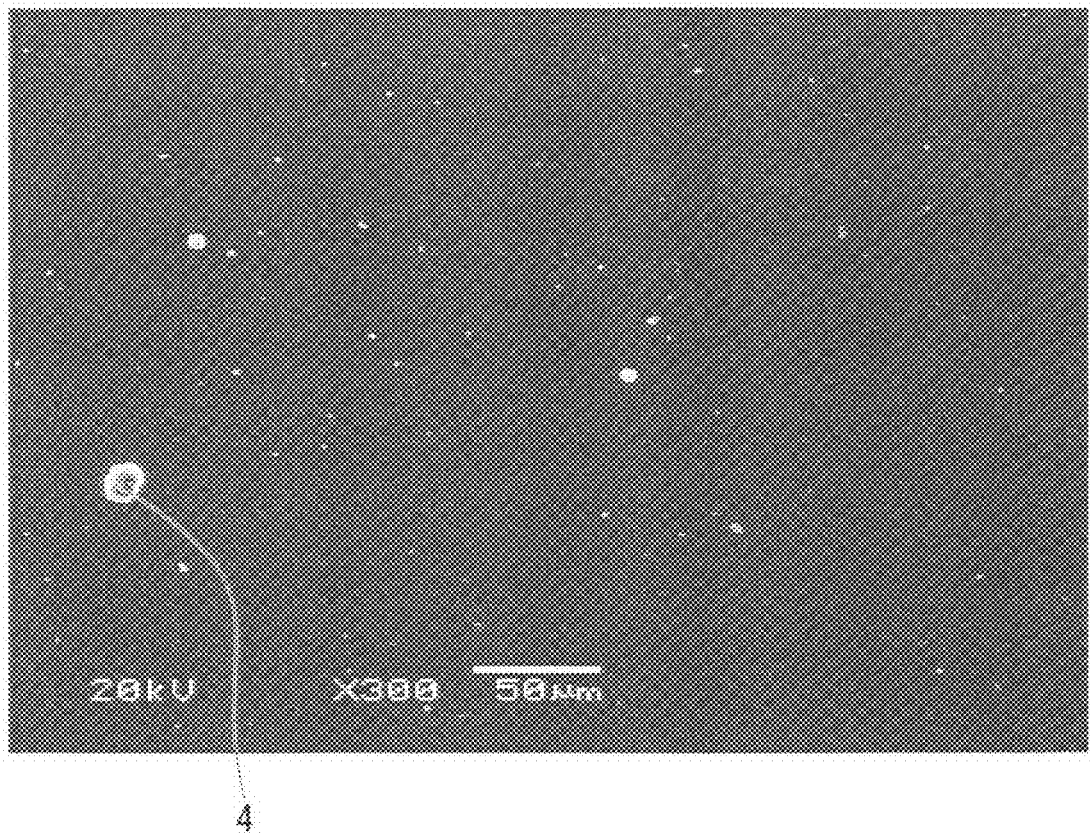
FIG. 5 is a view illustrating the first embodiment of the steam turbine blade related to the invention, and is a microscope picture diagram showing the surface of the ceramic hard film.
Figure 6:
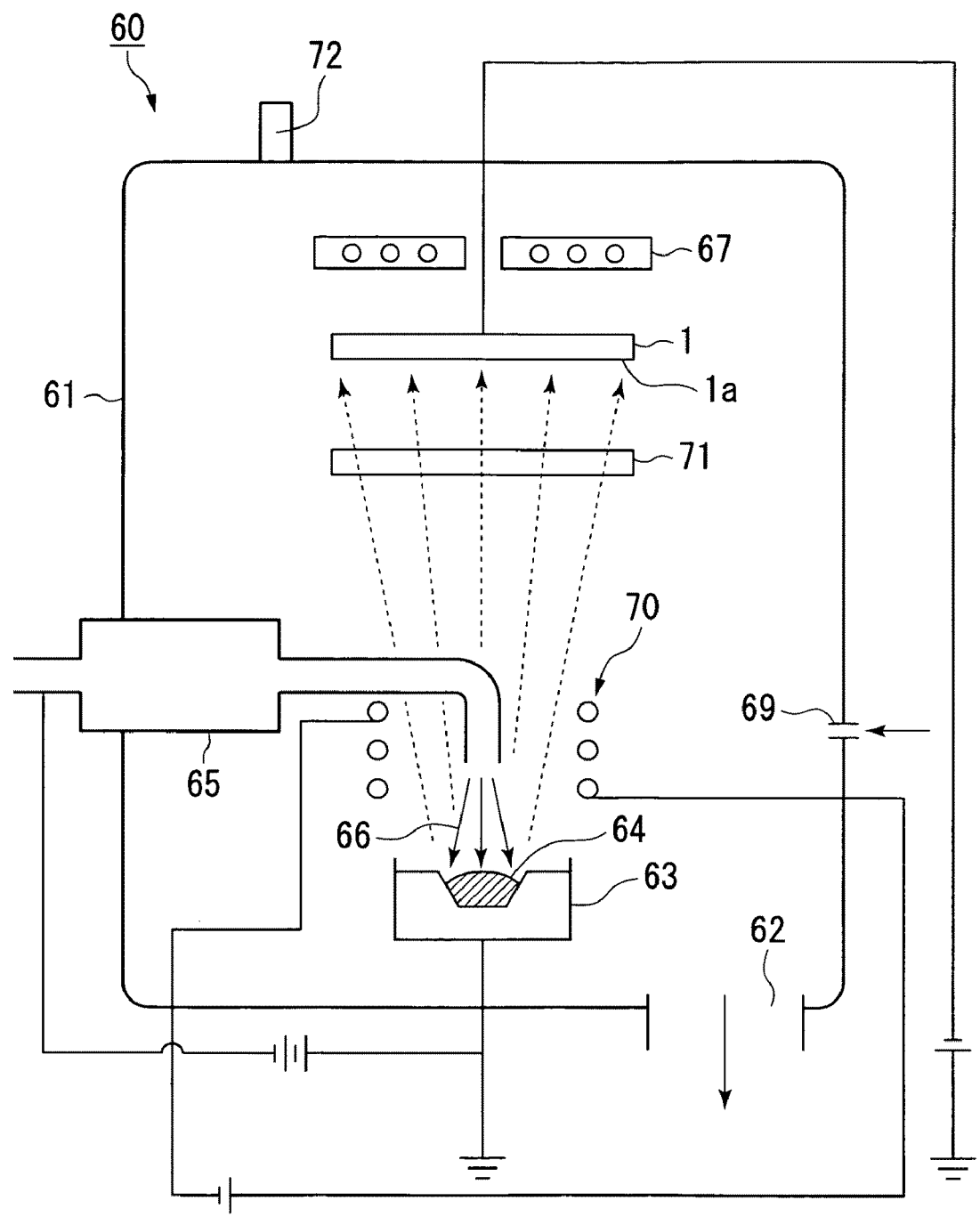
FIG. 6 is a view schematically illustrating a method for manufacturing the steam turbine blade (the part for a rotary machine) related to the invention, and is a schematic diagram showing an example of a film forming apparatus to be used when an interlayer and a ceramic hard film are formed on a base material.
Figure 7:
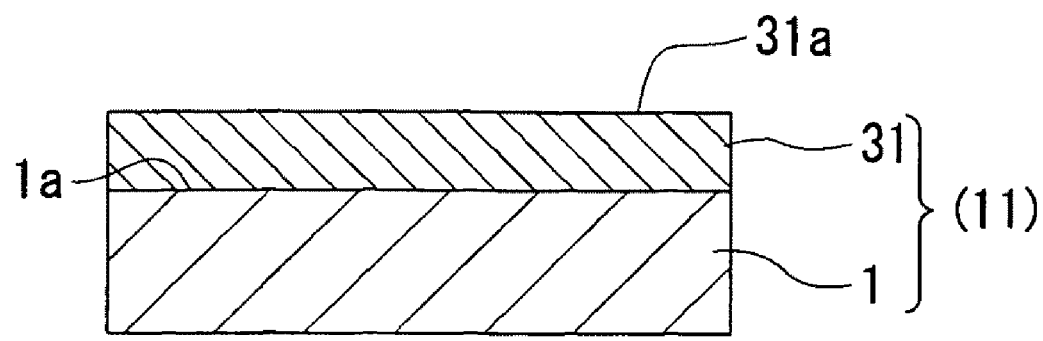
FIG. 7 is a view illustrating a second embodiment of the steam turbine blade related to the invention, and is a schematic sectional view showing a structure where a ceramic hard film is laminated on a base material.
Figure 8:
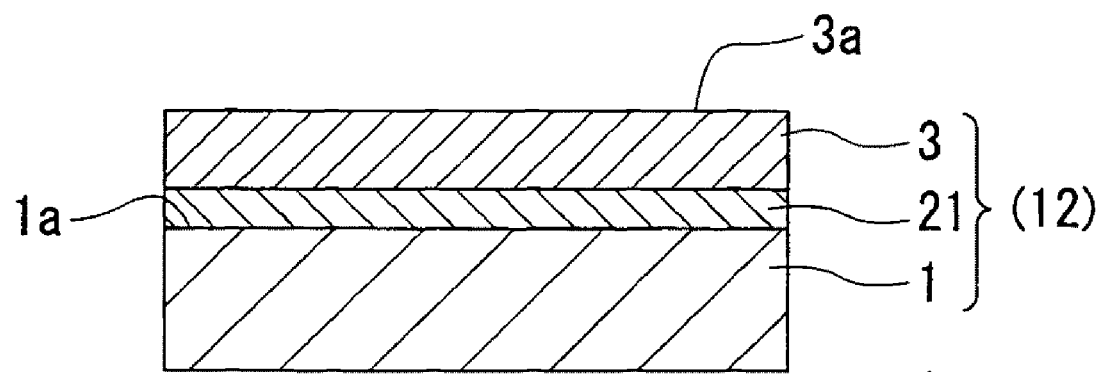
FIG. 8 is a view illustrating a third embodiment of the steam turbine blade related to the invention, and is a schematic sectional view showing a structure where an interlayer and a ceramic hard film are laminated sequentially on a base material.

FIGS. 1 to 6 are schematic diagrams illustrating a first embodiment of the steam turbine blade (a part for a rotary machine) related to the invention. FIG. 1 is a schematic diagram (perspective view) showing an example of a steam turbine for which the steam turbine blade is to be used. FIG. 2 is a perspective view showing the steam turbine blade. FIG. 3 is a sectional view showing a structure where an interlayer and a ceramic hard film are laminated sequentially on a base material. FIGS. 4A to 4C are schematic diagrams (sectional views) illustrating the effect of suppressing missing of droplets and drain erosion in the surface of a ceramic hard film. FIG. 5 is a microscope picture diagram showing the surface of the ceramic hard film. FIG. 6 is a schematic diagram showing an example of a film forming apparatus to be used when the ceramic hard film is formed. Additionally, FIG. 7 is a schematic diagram (sectional view) illustrating a second embodiment of the steam turbine blade related to the invention. FIG. 8 is a schematic diagram (sectional view) illustrating a third embodiment.

In addition, respective drawings to be referred to in the following description are drawings for describing a steam turbine blade (a part for a rotary machine), and the sizes, thicknesses, dimensions, etc. of respective parts which are shown in these respective drawings may be different from the dimensional relationship of an actual steam turbine blade (a part for a rotary machine).

[First Embodiment of Steam Turbine Blade]

Hereinafter, a first embodiment of a steam turbine blade which is a part for a rotary machine related to the invention will be described in detail.

The steam turbine blade related to the invention is a part for a rotary machine to be used as a moving blade (refer to a steam turbine blade 10 in FIG. 1) in, for example, in a steam turbine 40 shown in FIG. 1. The steam turbine 40 is driven by jetting the steam which is a working fluid toward the steam turbine blade 10 (moving blade) attached to the turbine 41. Such a steam turbine 40 is configured such that the steam turbine blade 10 contacts the steam directly.

The steam turbine blade 10 related to the invention, as shown in the sectional view of FIG. 3, is configured such that the ceramic hard film 3 for improving drain erosion proofness is formed on a surface 1a of a base material 1 (a substrate 1).

"Steam Turbine Blade"

The steam turbine blade 10, as shown in the sectional view of FIG. 3, is configured such that an interlayer 2 and the ceramic hard film 3 are laminated on the surface 1a of the base material 1. Additionally, in the steam turbine blade 10, the density of the droplets 4 (refer to the FIG. 4A) which exist in a surface 3a of the ceramic hard film 3 is set to be within 1000 pieces/mm$^2$, and the density of the droplets 4 whose mean particle diameter is 1 μm or less is set to be within 550 pieces/mm$^2$.

"Substance"

Hereinafter, the substances for the base material 1, the ceramic hard film 3, and the interlayer 2 which constitute the steam turbine blade 10 of this embodiment will be described in detail.

As the base material 1, for example, substances generally used in this field, such as stainless steel including SUS410J1, can be used without any limit, and can be selected suitably.

The ceramic hard film 3 is a film coated on the surface 1a of the base material 1 in the steam turbine blade 10.

As the substances for the ceramic hard film 3, any arbitrary substances may be adopted so long as they have high adhesion or drain erosion-proofness as a film. Particularly, substances including nitrides or carbides especially are preferable. Additionally, the ceramic hard film 3 is more preferably a film made of at least one or more kinds of TiN, CrN, TiAlN, TiC, TiCN, and ZrN among nitrides or carbides. As the ceramic hard film 3 is made of the above substances, it becomes possible to obtain the ceramic hard film 3 which is excellent in wear resistance and drain erosion-proofness.

The interlayer 2 is a film provided between the base material 1 and the ceramic hard film 3 as described above, and has the effects of relaxing the internal stress generated in the ceramic hard film 3 and further enhancing the adhesion between the base material 1 and the ceramic hard film 3.

The substances for the interlayer 2 preferably include Cr or Ti. As the interlayer 2 is made of such substances, the internal stress generated in the ceramic hard film 3 is more effectively relaxed. Accordingly, the adhesion between the base material 1 and the ceramic hard film 3 is further improved.

In addition, as a method for forming the interlayer 2, the same method as the film forming method of the ceramic hard film 3 which will be described in detail below can be adopted without any limit.

"Film Thickness"

In the steam turbine blade 10 of this embodiment as shown in FIG. 3, the film thickness of the ceramic hard film 3 is preferably set to a range of 5 μm or more and 15 μm or less. If the film thickness of the ceramic hard film 3 is less than 5 μm, there is a concern that the drain erosion proofness of the steam turbine blade 10 may degrade. Additionally, if the film thickness of the ceramic hard film 3 exceeds 15 μm, the productivity of the steam turbine blade 10 is reduced.

Additionally, in this embodiment, the film thickness of the ceramic hard film 3 is made greater than the film thickness of the interlayer 2, and the total film thickness of the ceramic hard film 3 and the interlayer 2 is set to a range of 5 µm or more and 20 µm or less. This film thickness configuration is more preferable from the point that both of excellent drain erosion-proofness of the steam turbine blade 10 and the high adhesion between base material 1 and the ceramic hard film 3 are obtained.

"Particle Diameter and Density of Droplet"

In the steam turbine blade of the invention, the density of the droplets 4 which exist in the surface 3a of the ceramic hard film 3 is defined to be within 1000 pieces/mm$^2$, and the density of the droplets 4 whose mean particle diameter is 1 µm or less is defined to be within 550 pieces/mm$^2$. More preferably, the density of the droplets 4 whose mean particle diameter is 1 µm or less is regulated to be within 500 pieces/mm$^2$ (also refer to the microscope picture diagram of FIG. 5).

In the steam turbine blade 10 of this embodiment, starting points of erosion are reduced by setting the density of all the droplets 4 which exist in the surface 3a of the ceramic hard film 3 to be within 1000 pieces/mm$^2$. Even in a case where some droplets 4 are missing and the surroundings thereof are eroded temporarily, it is believed that the missing of the droplets 4 does not influence the erosion of the other droplets 4 and their surroundings. Accordingly, the overall drain erosion-proofness in the surface 3a of the ceramic hard film 3 can be prevented from degrading.

Additionally, in the steam turbine blade 10 of this embodiment, the density of the droplets 4 which exist in the surface 3a of the ceramic hard film 3 and have a mean particle diameter of 1 µm or less is set to be within 550 pieces/mm$^2$. By this configuration of the droplets 4, as shown in the schematic diagrams of FIGS. 4A to 4C, it is believed that, when the drain 50 whose particle diameter is 100 to 200 µm collides against the droplets 4, the stress per unit area which acts on the droplets 4 is relaxed. This inhibits the droplets 4 from being missing from the surface 3a of the ceramic hard film 3. Accordingly, starting points of erosion in the surface 3a of the ceramic hard film 3 can be reduced, and the drain erosion-proofness in the surface 3a of the ceramic hard film 3 can be prevented from degrading.

A mechanism in which missing of the droplets 4 is suppressed in the surface 3a of the ceramic hard film 3 when the steam turbine blade 10 related to the invention is attached to the steam turbine 40 as shown in FIG. 1 will be described below referring to the schematic diagrams of FIGS. 4A to 4C. Similarly, a mechanism in which enlargement of drain erosion is suppressed in the surface 3a of the ceramic hard film 3 even in a case where the droplets 4 are missing, will be described below referring to FIGS. 4A to 4C.

When steam is jetted to the turbine 41 of the steam turbine 40, as shown in FIG. 4A, the drain 50 which has a diameter of about 100 to 200 µm first collides against the surface 3a of the ceramic hard film 3. In this case, the droplets 4 which exist in the surface 3a of the ceramic hard film 3 exist mainly with small diameter at low density, as described above. Therefore, the stress per unit area which acts on the droplets 4 is small. For this reason, as shown in FIG. 4B, the droplets 4 are not missing and remain on the surface 3a of the ceramic hard film 3. Additionally, as shown in FIG. 4C, even in a case where some of the droplets 4 are missing, grooves 3b generated in those portions will have a small diameter. Accordingly, drain erosion is not greatly increased with the grooves 3b as starting points. Additionally, the density of the droplets 4 which exist in the surface 3a of the ceramic hard film 3 is suppressed. Accordingly, even in a case where the droplets 4 are missing, drain erosion can be inhibited from being increased by an interaction.

In addition, in order to measure the particle diameter and number of the droplets 4, for example, as shown in FIG. 5 (also refer to the sectional view of FIG. 3), the surface 3a of the ceramic hard film 3 is photographed by a factor of 300 times in an arbitrary field of view (a field of view of 0.42 mm*0.316 mm) by using an electron microscope. The particle diameter of the droplets can be measured by counting the droplets 4 and obtaining their average in an arbitrary field of view after this microscope picture diagram is enlarged to about A4 size.

Additionally, the drain erosion-proofness of the surface 3a of the ceramic hard film 3 can be evaluated by, for example, a cavitation erosion test. In this case, the evaluation can be made, for example, by measuring the amount of cavitation erosion (the amount of weight loss) after a test is performed for about 6 hours.

"Method for Manufacturing Steam Turbine Blade"

Hereinafter, a method for manufacturing the steam turbine blade (a part for a rotary machine) 10 of this embodiment will be described in detail, mainly referring to FIG. 6. FIG. 6 is a schematic diagram showing an example of the film forming apparatus used when the interlayer 2 and the ceramic hard film 3 are formed on the surface 1a of the base material 1. In this embodiment, a method for forming the ceramic hard film 3, which is provided in the laminated structure of the steam turbine blade 10 as shown in FIG. 3, will be described taking the method for forming a film by using the film forming apparatus 60 as shown in FIG. 6 as an example.

The method for manufacturing a steam turbine blade related to the invention is a method for forming the ceramic hard film 3 on the surface 1a of the base material 1 by at least an ion plating method or a sputtering method when the steam turbine blade 10 of the above configuration is manufactured. Additionally, in this embodiment, the ceramic hard film 3 is formed by a hollow cathode type ion plating method. As this ion plating method, a method will be described which is performed under film forming conditions such that melting power (P1) that is the output from electron rays 66 of a plasma gun 65 to the area of the evaporation surface of a coating substance 64 (evaporation source) is set to a range of 550 (W/cm$^2$) or more and 980 (W/cm$^2$) or less and that focusing power (P2) that is the electromagnetic output to the surface area of a focusing coil 70 is set to a range of 80 (mW/cm$^2$) or more and 150 (mW/cm$^2$) or less.

Although a general PVD can be used as the film forming method of a ceramic hard film, one of the most suitable film forming methods includes an ion plating method which melts and vapor-deposits a substance by electron beams or the like. Particularly, it is preferable that a hollow cathode type ion plating method (HCD (Hollow Cathode Discharge) method) which melts a coating substance and performs vapour deposition processing, by a plasma gun and a focusing coil, be used as the film forming method of a ceramic hard film. In such a method, it becomes possible to achieve the particle diameter and density of droplets which are specified in the invention by precisely controlling the output of the plasma gun and the output of the focusing coil when a substance to be vapor-deposited is melted.

An example of a film forming apparatus using the hollow cathode type ion plating method is shown in FIG. 6. The film forming apparatus 60 generally includes a vacuum housing 61 which can be evacuated through an exhaust hole 62, and a crucible 63, a plasma gun 65, a focusing coil 70, and a heater 67, which are arranged inside the vacuum housing 61. The coating substance 64 is accommodated in the crucible 63. The plasma gun 65 emits the electron rays 66 for heating and evaporating the coating substance 64, and ionizing and depositing the substance on the surface 1a of the substrate 1. The focusing coil 70 focuses the electron rays 66 on the coating substance 64. The heater 67 heats the substrate 1.

Additionally, like the illustrated example, a shutter 71 is provided between the crucible 63 and the substrate 1 so as to be able to prevent adhesion of unnecessary coating substance 64. Moreover, a DC bias power source for applying a negative voltage (bias voltage) to the crucible 63 is connected to the substrate 1. Furthermore, the film forming apparatus 60 is provided with a mass spectrometer 72 for measuring residual gas components or the like within the vacuum housing 61.

Hereinafter an example of a procedure when a film forming process is carried out using the film forming apparatus 60 of the above configuration will be described.

First, the substrate 1 made of 13Cr stainless steel (SUS410J1) is arranged within the vacuum housing 61, and the inside of the vacuum housing 61 is evacuated to $5*10^{-5}$ torr or less, and its pressure is reduced.

Next, the substrate 1 is burned by heating the substrate 1 to a temperature of 450° C. or more and 550° C. or less by the heater 67, and by holding the substrate for 30 minutes or more at this temperature.

Next, the plasma gun 65 and the focusing coil 70 are started while the output of the plasma gun 65 and the focusing coil 70 is suitably adjusted, and the melting power P1 (W/cm$^2$) and the focusing power P2 (mW/cm$^2$) are controlled. In this case, the shutter 71 is maintained in a closed state. Here, the melting power P1 (W/cm$^2$) described in the invention is a numeric value obtained by dividing the output (W) of the electron rays 66 of the plasma gun 65 by the area (cm$^2$) of the evaporation surface of the coating substance 64 accommodated in the crucible 63. Additionally, the focusing power P2 (mW/cm$^2$) is a numeric value obtained by dividing the electromagnetic output (W) of the focusing coil 70 by the surface area (cm$^2$) of the focusing coil 70.

In this invention, before the coating substance 64 is vapor-deposited on the substrate 1, the coating substance is held for 10 minutes or more and 30 minutes or less in a state where the melting power P1 is an output that is increased more than a rated output by about 5% or more and about 20% or less by increasing the output of the plasma gun 65 with the shutter 71 closed. Therefore, it is preferable to return the output of the plasma gun 65 to the rated output to open the shutter 71, and to perform film forming processing. This makes it possible to extract particles, which are apt to be scattered, in advance before the coating substance 64 is vapor-deposited on the surface 1a of the substrate 1. Therefore, droplets can be reduced, and a stable film can be formed.

Then, film forming processing is performed by opening the shutter 71, thereby vapor-depositing the coating substance 64 on the surface 1a of the substrate 1. In this case, if required, the film forming processing is performed while a bias voltage is applied between the substrate 1 and the crucible 63.

In addition, the above-mentioned melting power P1 is preferably set to a range of 550 (W/cm$^2$) or more and 980 (W/cm$^2$) or less. If the output P1 is within the above range, the coating substance 64 can be melted and extracted efficiently and reliably, and the film forming processing can be performed with good film quality. Additionally, the focusing power P2 when the melting power P1 is set to the above range is preferably set to a range of 80 (mW/cm$^2$) or more and 150 (mW/cm$^2$) or less.

It becomes possible to achieve the particle diameter and density of droplets which are specified in the invention by setting melting power P1 to the above range as well as setting the focusing power P2 to such a range, and controlling these P1 and P2 precisely.

Here, if the melting power P1 exceeds 980 (W/cm$^2$), there is a concern that power may be too strong and grains with large droplets may be created in the film surface. On the other hand, if the melting power P1 is less than 550 (W/cm$^2$), there is a concern that a film forming rate may become low and productivity may be reduced.

Additionally, the above range of the focusing power P2 is preferable. However, if the focusing power P2 exceeds the above range, there is a concern that grains with large droplets may be created in the film surface. On the other hand, if the focusing power P2 is less than the above range, it becomes difficult to focus the melting power P1 precisely.

Additionally, when a compound like TiN is coated using the film forming apparatus 60, for example, TiN can be deposited on the surface 1a of the substrate 1 by using and evaporating Ti for the coating substance 64, and supplying a reaction gas (N$_2$) from an inlet 69.

Additionally, the film forming method of a ceramic hard film using the HCD method as described above can also be applied to film forming processing of an interlayer without any limit. In such a case, for example, the melting power P1 is preferably set to a range of 450 (W/cm$^2$) or more and 550 (W/cm$^2$) or less. Additionally, the focusing power P2 when the melting power P1 is set to the above range is preferably set to a range of 80 (mW/cm$^2$) or more and 120 (mW/cm$^2$) or less.

[Second Embodiment of Steam Turbine Blade]

Hereinafter, a steam turbine blade 11 of this embodiment will be described in detail, referring to FIG. 7. In addition, in the following description, the same components as the steam turbine blade 10 of the first embodiment will be denoted by common reference numerals, and the detailed description thereof will be omitted.

The steam turbine blade 11 of this embodiment is different from the steam turbine blade 10 of the first embodiment in that the interlayer is not provided between the base material 1 and a ceramic hard film 31.

In the steam turbine blade 11 of this embodiment, a film to be formed on the surface 1a of the base material 1 is formed as a monolayer consisting only of the ceramic hard film 31. The film thickness of the ceramic hard film 31 having such a monolayer structure is preferably set to a range of 5 μm or more and 15 μm or less. By setting the film thickness of the ceramic hard film 31 to the above range, the particle diameter and density of the droplets 4 (refer to FIG. 4A) which exist on the surface of the ceramic hard film 31 can be controlled properly and easily within the same range as the steam turbine blade 10 of the above first embodiment.

In addition, as the base material 1 and the ceramic hard film 3, which are provided in the steam turbine blade 10 of the above first embodiment, those having the same configuration as the base material 1 and the ceramic hard film 31, which are provided in the steam turbine blade 11 of this embodiment, can be used. Additionally, as a film forming method of applying the ceramic hard film 31 onto the surface 1a of the base material 1, the same method as that of the steam turbine blade 10 of the first embodiment can be adopted.

According to the steam turbine blade 11 of this embodiment, the effect that drain erosion-proofness is improved is obtained by the above configuration, similarly to the steam turbine blade 10 of the above first embodiment.

In addition, in this embodiment, an interlayer made of the same substance as the ceramic hard film 31, for example, TiN or the like, is first formed on the base material 1, and the ceramic hard film 31 made of TiN is formed on the interlayer. As a result, it is also possible to obtain a single substance film as shown in FIG. 7. In this case, the internal stress generated in the ceramic hard film 31 is relaxed by the action of the interlayer made of the same substance as the ceramic hard film 31, similarly to the steam turbine blade 10 of the first embodiment. Accordingly, the effect that the adhesion between the base material 1 and the ceramic hard film 3 is improved is obtained.

[Third Embodiment of Steam Turbine Blade]

Hereinafter, the steam turbine blade 12 of this embodiment will be described in detail, referring to FIG. 8. In addition, in the following description, the same components as the steam turbine blades 10 and 11 of the first and second embodiments will be denoted by common reference numerals, and the detailed description thereof will be omitted.

The steam turbine blade 12 of this embodiment is different from the steam turbine blade 10 of the first embodiment in that an interlayer 21 formed between the base material 1 and the ceramic hard film 3 is made of CrN or TiN.

In this embodiment, the internal stress generated in the ceramic hard film 3 is effectively relaxed similarly to the steam turbine blade 10 of the first embodiment by making the interlayer 21 of the above substance. Accordingly, the adhesion between the base material 1 and the ceramic hard film 3 becomes good.

Additionally, as for the film thickness of the interlayer 21 and the ceramic hard film 3, the film thickness of the ceramic hard film 3 is preferably set to be greater than the film thickness of the interlayer 21, similarly to the above first embodiment. Simultaneously, the total film thickness of the ceramic hard film 3 and the interlayer 21 is preferably set to a range of 5 μm or more and 20 μm or less. As such, the thicknesses of the ceramic hard film 3 and the interlayer 21 are set to the above relationship, and are set to the thicknesses of the above ranges. By this configuration, similarly to the above first embodiment, the particle diameter and density of the droplets 4 which exist in the surface 3a of the ceramic hard film 3 can be easily controlled within a proper range. Additionally, the residual stress of the interlayer 21 can also be relaxed by adopting the laminated film of the above configuration. Accordingly, the internal stress of the whole film formed on the base material 1 becomes small compared with a monolayer film of the same thickness.

Additionally, the ceramic hard film 3 of this embodiment is the same film as the above first embodiment, and the substance, film thickness, film forming method, etc. thereof can be made common.

Additionally, as a method for forming the above interlayer 21, the same film forming method as the ceramic hard film 3 in the first embodiment 3 can be applied without any limit.

[Other Examples of Parts for Rotary Machine]

In this invention, parts for a rotary machine, such as an impeller or a rotor, which are used in, for example, chemical plants or the like, and are provided in a compressor pump which compresses various gases, can be configured by forming the same ceramic hard film as the above steam turbine blade on the surface of a base material.

There is an impeller as another example of parts for a rotary machine related to the invention. Although detailed illustration is omitted, for example, when an impeller of a compressor pump is configured, the surface of the impeller can be provided with the ceramic hard film as the steam turbine blade as shown in FIG. 3 or the like. By this configuration, even if gas directly contacts the impeller, droplets which exist on the surface of the ceramic hard film can be inhibited from being missing, similarly to the above steam turbine blade.

Additionally, even in a case where some of the droplets which exist on the surface of the ceramic hard film are missing, and drain erosion occurs therearound, the missing droplets can be inhibited from having an influence on other droplets. Accordingly, the effect of inhibiting overall drain erosion-proofness from degrading is obtained.

Moreover, the same interlayer as the above steam turbine blade may be provided between the base material and the ceramic hard film. This configuration is a more preferable configuration from the viewpoint of the effect that the internal stress generated in the ceramic hard film is relaxed, and the adhesion between the base material and the ceramic hard film is further enhanced.

Additionally, since the ceramic hard film and the interlayer of the part for a rotary machine related to the invention are the same film as the above steam turbine blade, a manufacturing process, such as a film forming method, besides the substance, film thickness, etc. of the ceramic hard film, can also be made common.

For example, the HCD method is adopted as a method for forming a ceramic hard film in the impeller surface of the compressor pump as described above, and a ceramic hard film is formed on the surface of a base material under the same conditions as the above. According to this method, it becomes possible to control the particle diameter and density of droplets which exist on the surface of the ceramic hard film to the same proper ranges as the above.

As described above, according to the steam turbine blade (a part for a rotary machine) related to the invention, the density of the droplets 4 which exist in the surface 3a of the ceramic hard film 3 is set to be within 1000 pieces/mm$^2$, and the density of the droplets 4 whose mean particle diameter is 1 μm or less is set to be within 550 pieces/mm$^2$. According to this configuration, since generation of starting points of drain erosion decreases, the drain erosion-proofness under an environment where the part for a rotary machine directly contacts steam is improved. Accordingly, a steam turbine blade which is excellent in drain erosion proofness, is inexpensive, and is long in life can be realized.

Additionally, according to the method (method for manufacturing a part for a rotary machine) for manufacturing a steam turbine blade related to the invention, at least an ion plating method or a sputtering method is used as the method for forming the ceramic hard film 3 on the surface 1a of the base material 1 when the steam turbine blade of the above configuration is manufactured. The particle diameter and density of the droplets 4 which exist in the surface 3a of the ceramic hard film 3 can be reduced by these manufacturing methods. Accordingly, a steam turbine blade which is excellent in drain erosion proofness, is inexpensive, and has a long life cycle can be realized with high production efficiency.

WORKING EXAMPLES

Although working examples are shown and the parts for a rotary machine and its manufacturing method of the invention will described in more detail below, the invention is not limited to these working examples.

Figure 9A:
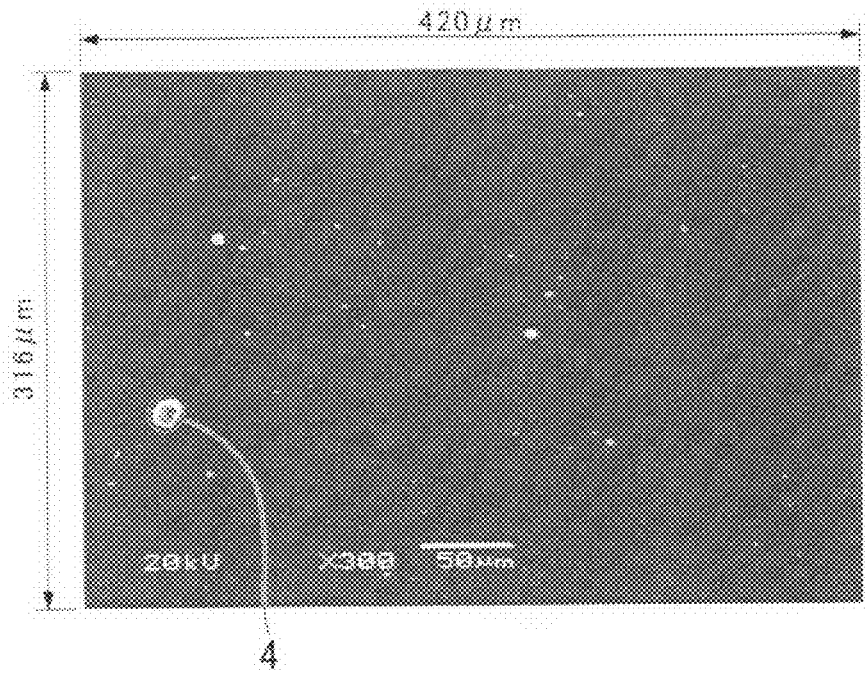
FIG. 9A is a schematic diagram illustrating a working example of the part for a rotary machine related to the invention, and is an example of microscope picture diagrams showing a method for measuring the particle diameter and number of droplets in the surface of a ceramic hard film (working example 1)
Figure 9B:
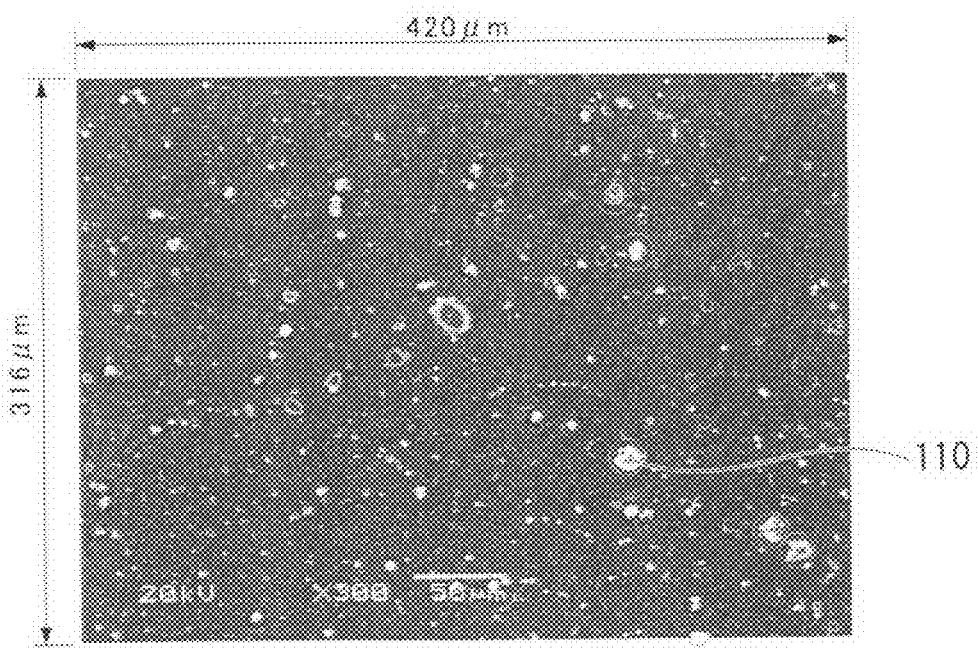
FIG. 9B is a schematic diagram illustrating a comparative example of a part for a rotary machine, and is an example of microscope picture diagrams showing a method for measuring the particle diameter and number of droplets in the surface of a ceramic hard film (comparative example 2)
Figure 10:
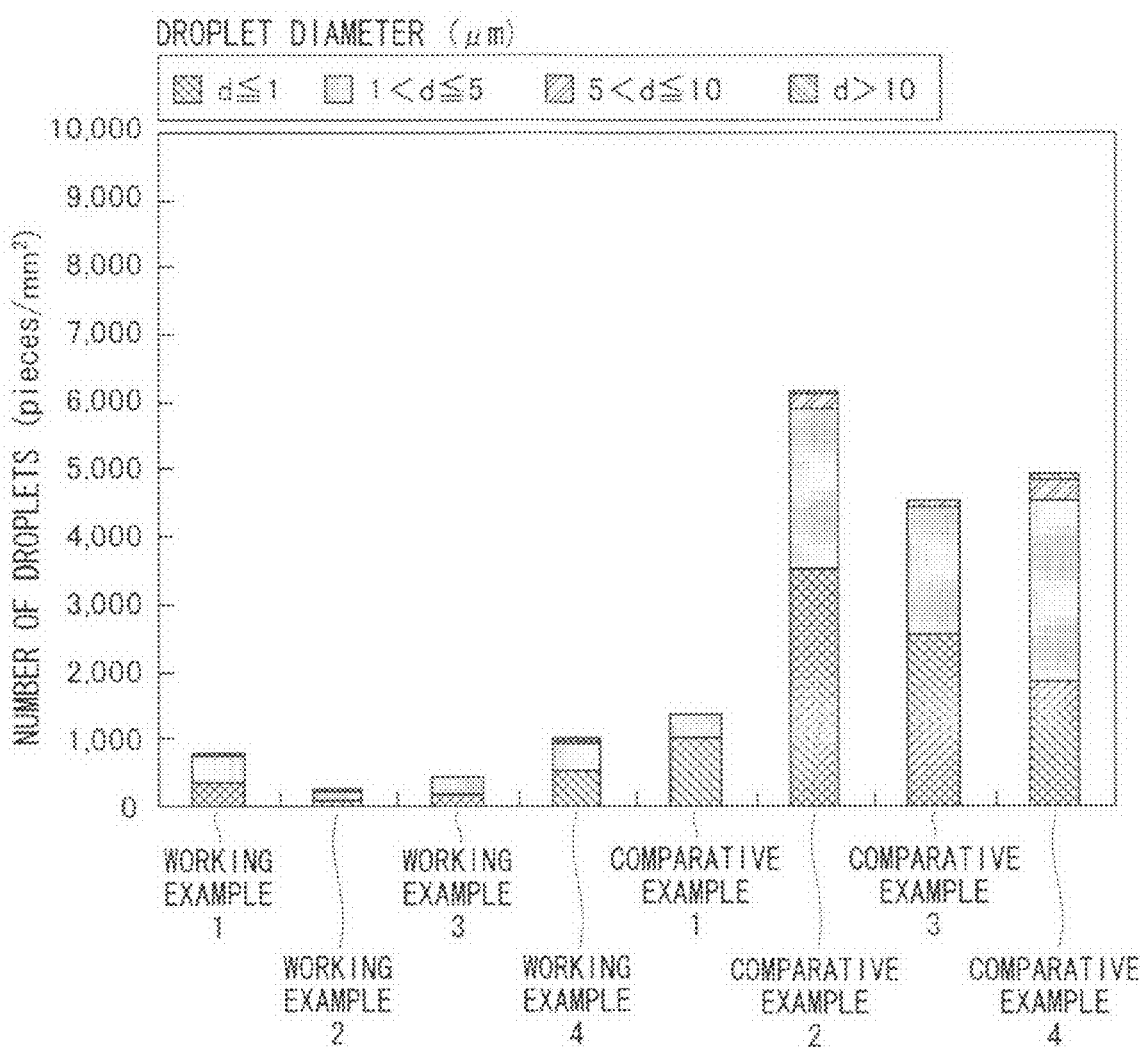
FIG. 10 is a schematic diagram illustrating working examples of the part for a rotary machine related to the invention, and is a graph showing measurement results of the number of droplets in the surface of a ceramic hard film.
Figure 12:
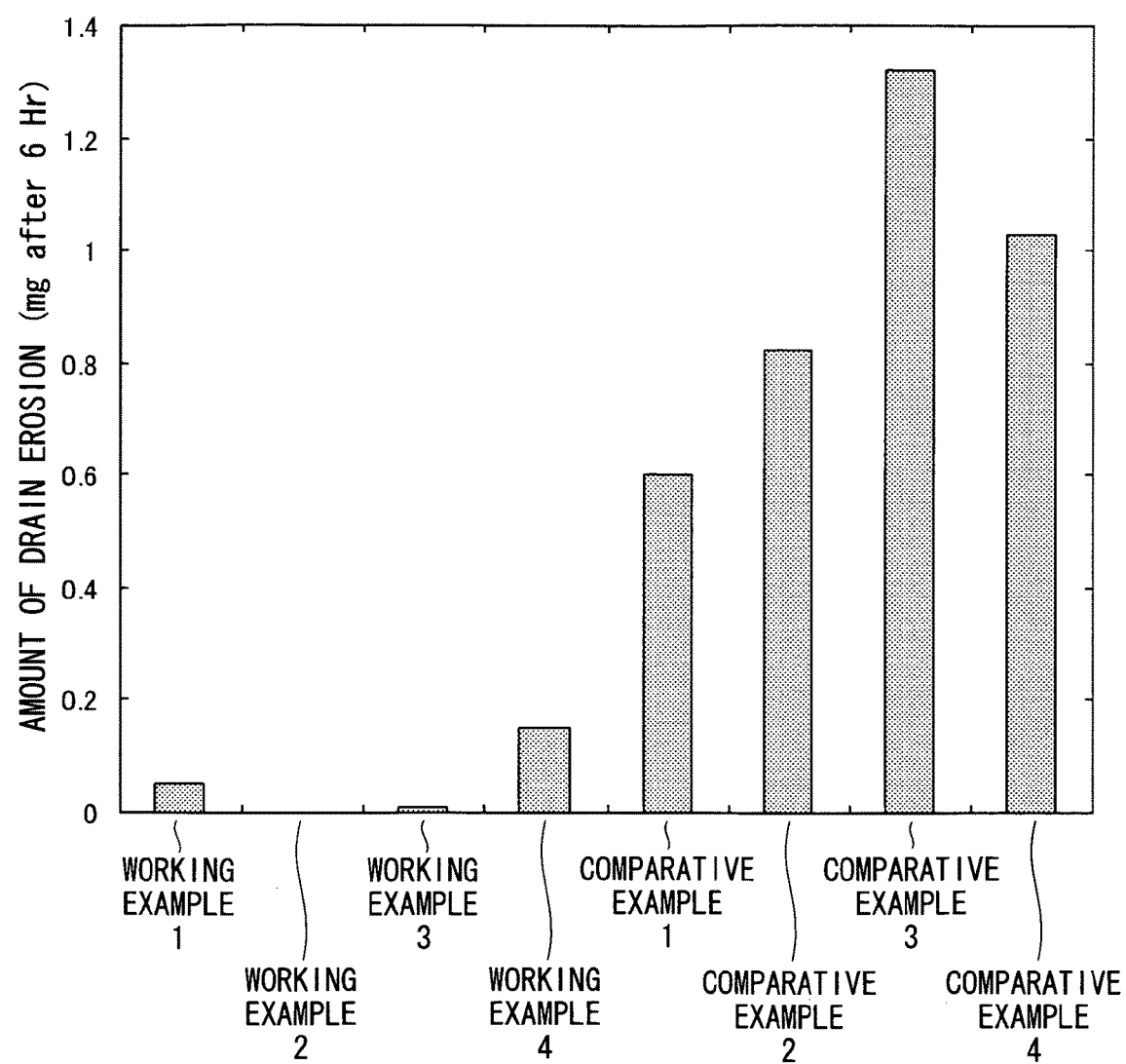
FIG. 12 is a schematic diagram illustrating working examples of the part for a rotary machine related to the invention, and is a graph showing evaluation results of drain erosion-proofness.
Figure 13:
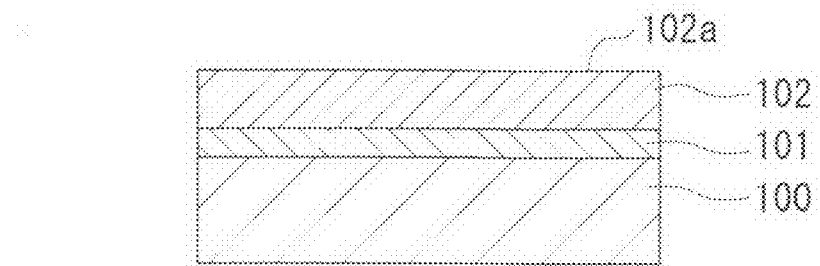
FIG. 13 is a schematic diagram illustrating a conventional steam turbine blade, and is a sectional view showing a laminated structure in which a hard film is formed on a base material.
Figure 14:
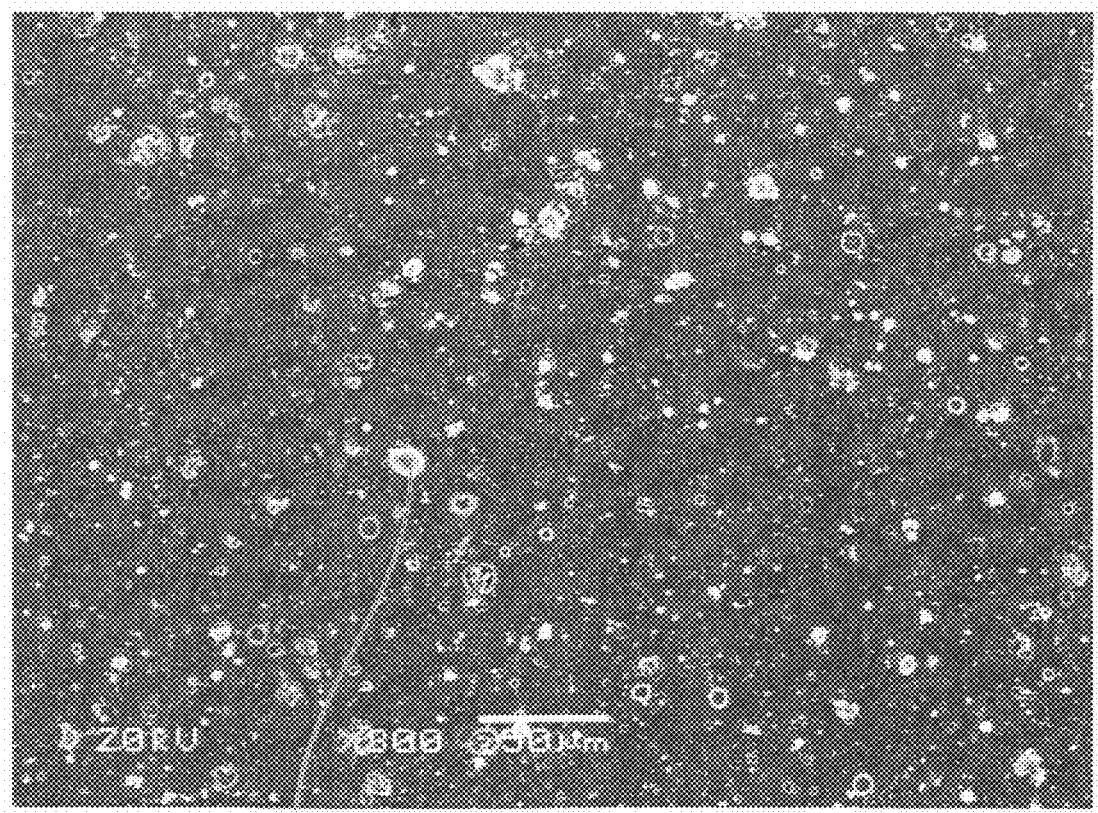
FIG. 14 is a view illustrating the conventional steam turbine blade, and is a microscope picture diagram showing the surface of the hard film.
Figure 15A:
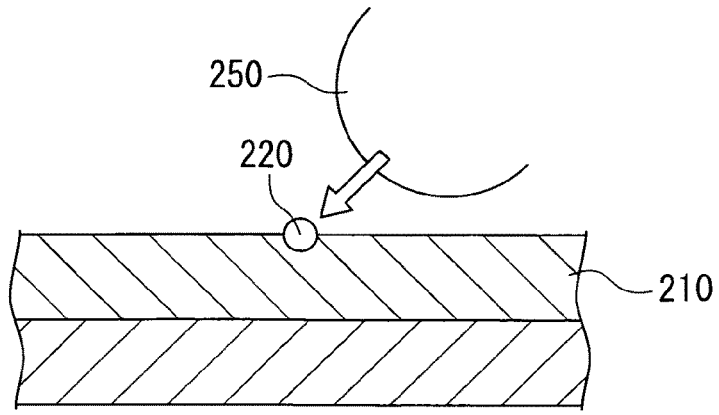
FIG. 15A is a view illustrating the conventional steam turbine blade, and is a sectional view showing a state where the drain (water droplets) collide against the hard film of the surface of the steam turbine blade.
Figure 15B:
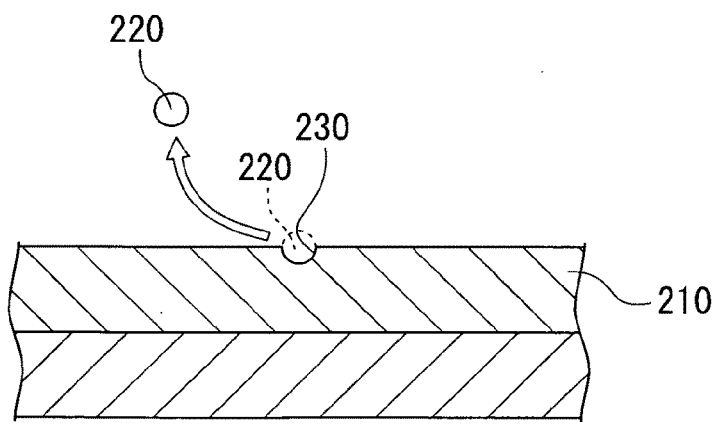
FIG. 15B is a view illustrating the conventional steam turbine blade, and a sectional view showing a state where droplets which exist on the surface of the hard film of the surface of the steam turbine blade are missing from the hard film.
Figure 15C:
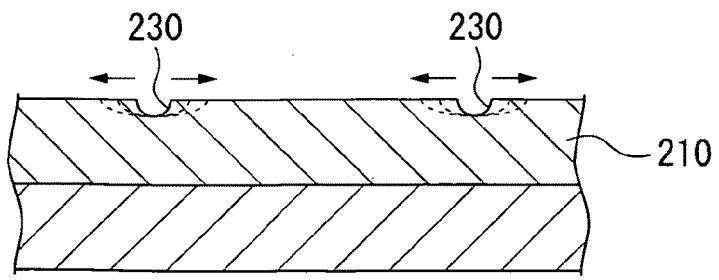
FIG. 15C is a view illustrating the conventional steam turbine blade, and is a sectional view showing a state where a recess, which is formed by missing of droplets, in the surface of the hard film of the surface of the steam turbine blade is enlarged.

FIGS. 9A to 12 are schematic diagrams illustrating working examples of the embodiment of the invention and comparative examples. FIGS. 9A and 9B are microscope picture diagrams showing a method for measuring the particle diameter and number of droplets 4 and droplets 110 in the surface of a ceramic hard film. FIG. 10 is a graph showing test results of the number of droplets in the surface of the ceramic hard film. FIG. 11A to FIG. 11C are schematic diagrams showing a testing device for evaluation of drain erosion proofness. FIG. 12 is a graph showing evaluation results of drain erosion-proofness.

In this embodiment, first, samples of Working Examples 1 to 4 were manufactured by forming an interlayer and a ceramic hard film sequentially on a base material under respective film forming conditions as shown in the following Table 1 by the ion plating method using the HCD (Hollow Cathode Discharge) method. Further, samples of Comparative Examples 1 to 4 were manufactured by forming an interlayer and a ceramic hard film sequentially on a base material under respective film forming conditions as shown in the following Table 2 by using the HCD method or the AIP (Arc Ion Plating) method (refer to the following Table 3). Then, respective evaluation tests of these samples which will be described below were performed.

[Manufacture of Test Pieces of Working Examples 1 to 4]

First, a base material made of 13Cr stainless steel (SUS410J1) was prepared as the base material 1. Then, the film forming apparatus 60 as shown in FIG. 6 was used to form an interlayer and a ceramic hard film sequentially on the surface 1a of the base material 1 according to the following procedure.

First, the substrate 1 is arranged within the vacuum housing 61, and the inside of the vacuum housing 61 is evacuated to $5*10^{-5}$ torr or less, and its pressure is reduced. Next, the substrate 1 was burned by heating the substrate 1 to a temperature of 450° C. or more and 550° C. or less by the heater 67, and by holding the substrate for 30 minutes or more at this temperature.

Additionally, Cr was accommodated in the crucible 63 as the coating substance 64 serving as the substance for the interlayer 2 when the interlayer 2 was formed as a film. When the ceramic hard film 3 was formed on the interlayer, Ti was accommodated as the coating substance serving as the substance for the interlayer 3.

Next, with the shutter 71 closed, the plasma gun 65 and the focusing coil 70 were started while the output of the plasma gun 65 and the focusing coil 70 was suitably adjusted, and the melting power P1 (W/cm$^2$) and the focusing power P2 (mW/cm$^2$) were controlled to numerical values shown in the following Table 1. Here, the melting power P1 (W/cm$^2$) described in this working example is a numeric value obtained by dividing the output (W) of the electron rays 66 of the plasma gun 65 by the area (cm$^2$) of the evaporation surface of the coating substance 64 accommodated in the crucible 63. Additionally, the focusing power P2 (mW/cm$^2$) is a numeric value obtained by dividing the electromagnetic output (W) of the focusing coil 70 by the surface area (cm$^2$) of the focusing coil 70.

Then, the coating substance was held for 10 minutes or more and 30 minutes or less in a state where the melting power P1 is an output that is increased more than a rated output by about 5% or more and about 20% or less by increasing the output of the plasma gun 65 with the shutter 71 closed. By this operation, particles in the coating substance 64 which are apt to be scattered were extracted in advance.

Next, the interlayer 2 made of Cr was first formed as a film by returning the melting power P1 to the rated output to open the shutter 71 wide, and vapor-depositing and depositing the coating substance 64 (Cr) on the surface 1a of the substrate 1.

Next, the coating substance 64 to be accommodated in the crucible 63 was changed to Ti. Additionally, the ceramic hard film 3 made of TiN was formed on the interlayer 2 made of Cr, which was formed as a film according to the above procedure, according to the same procedure as the above, with numeric values as shown in the following Table 1 as the respective film forming conditions. In addition, when TiN was formed as a film, a reaction gas (N$_2$) was supplied through the inlet 69 while the coating substance 64 was evaporated.

In addition, in the film forming processing of the interlayer 2 and the ceramic hard film 3, if required, the bias voltage of a numeric value shown in the following Table 1 was applied between the substrate 1 and the crucible 63.

Additionally, the operation for several minutes was performed with the output P1 increased by 5 to 20% of a standard value for melting stabilization of the plasma gun 65 and the coating substance 64 before film forming. At this time, the temporal changes of respective partial pressures of H$_2$O and O$_2$ were measured by the mass spectrometer 72 connected to the vacuum housing 61.

Four kinds of test pieces of Working Examples 1 to 4 were respectively manufactured by forming Cr whose film thickness is 3 μm as the interlayer 2 on the surface 1a of the substrate 1 under the respective conditions shown in the following Table 1 and forming TiN whose film thickness is 10 μm as the ceramic hard film 3 on the interlayer, according to the above procedure.

TABLE 1

| Test Piece | Film Substance Upper Stage: Interlayer Lower Stage: Ceramic Hard Film | Substrate Temperature | Melting Power P1 | Focusing Power P2 | Bias Voltage | Plasma Gun Stabilizing Operation Increasing Rate of Melting Power P1 | Holding Time |
|---|---|---|---|---|---|---|---|
| Working Example 1 | Cr | 500° C. | 530 W/cm² | 100 mW/cm² | 0 V | 0% | 0 min |
| | TiN | | 920 W/cm² | 145 mW/cm² | −130 V | 10% | 10 min |
| Working Example 2 | Cr | 500° C. | 530 W/cm² | 100 mW/cm² | 0 V | 0% | 0 min |
| | TiN | | 920 W/cm² | 145 mW/cm² | −130 V | 10% | 30 min |
| Working Example 3 | Cr | 500° C. | 530 W/cm² | 100 mW/cm² | 0 V | 0% | 0 min |
| | TiN | | 920 W/cm² | 145 mW/cm² | −130 V | 20% | 10 min |
| Working Example 4 | Cr | 500° C. | 530 W/cm² | 100 mW/cm² | 0 V | 0% | 0 min |
| | TiN | | 920 W/cm² | 145 mW/cm² | −130 V | 5% | 10 min |

[Manufacture of Test Pieces of Comparative Examples 1 to 4]

Similarly to the above Working Examples 1 to 4, a base material made of 13Cr stainless steel (SUS410J1) was prepared, and an interlayer and a hard film were formed sequentially on the base material according to the following procedure under respective conditions shown in the following Table 2.

First, as Comparative Example 1, the HCD method was used to form an interlayer and a hard film sequentially on a base material under each film forming condition shown in the following Table 2, thereby manufacturing a test piece. This is the same film forming condition as the condition disclosed in the above-mentioned Japanese Patent Publication No. 8-30264.

Further, as Comparative Examples 2 to 4, the AIP method was used to form an interlayer and a hard film sequentially on a base material under respective film forming conditions shown in the following Table 2, thereby manufacturing respective test pieces. The AIP method is one of film forming methods of a hard film applied to tools or the like, and particularly, a method for forming a film having excellent adhesion force (also refer to paragraphs 0059 to 0065 of Japanese Patent No. 3633837 for a film forming method by the AIP method). Additionally, in test pieces of Comparative Examples 2 to 4, the same conditions as the film forming conditions of TiN applied in typical tools etc. were adopted as the film forming conditions, and film forming processing was made by changing bias voltage, thereby manufacturing three kinds of test pieces.

[Evaluation of Test Items]

Various evaluation tests of items as will described below were carried out on the test pieces of Working Examples 1 to 4 and Comparative Examples 1 to 4 manufactured by the above procedure, and results thereof are shown in the following Table 3.

"Measurement of Particle Diameter and Density of Droplets"

The particle diameter and number (density) of droplets were measured by photographing the surface of a test piece in arbitrary fields of view (field of view of 0.42 mm*0.316 mm) by a factor of 300 times by using a scanning electron microscope as shown in the microscope picture diagrams of FIG. 9A (working example 1) and FIG. 9B (comparative example 2), and enlarging this to A4 size, and then by counting droplets (droplets 4 or droplets 110) and their average in each arbitrary field of view. In this case, the density (pieces/mm$^2$) was obtained by counting the number of droplets at each of four levels including "1 μm or less", "more than 1 μm to 5 μm or less", "more than 5 μm to 10 μm or less", and "more than 10 μm", and obtaining their average to convert the average to the number per 1 mm$^2$. The results are shown in the graph of FIG. 10 and the following Table 1.

"Evaluation of Drain Erosion-Proofness"

The drain erosion-proofness of a film formed on the surface of each test piece was evaluated by a cavitation erosion test according to ASTM G32-77.

The shape and dimension value of a test piece A of each of the working examples and comparative examples used for the cavitation erosion test are shown in FIGS. 11A and 11B. As shown in FIGS. 11A and 11B, the formation range of a film in each test piece A was set to a planar portion of 15.9 mm and a peripheral direction of 7 mm except a thread portion.

A flowsheet diagram of a cavitation erosion testing device 80 used in this working example is shown in FIG. 11C. In this working example, an evaluation test was performed by a method of oscillating a vibrator 81 by a supersonic wave transmitter 86, enlarging the amplitude by an enlarging horn 82 made of a Ti-6Al-4V alloy, and vibrating the test piece A attached to the tip of the horn. In this case, the tip of the test piece A was vibrated while being immersed in a test-piece liquid 85 as long as about 2 to 3 mm, and bubbles were generated. Then, erosion was generated by the impact pressure and liquid jet when the bubbles were collapsed. Additionally, a test environment in this case included a condition where the test was carried out up to 6 hours at repetition speed: 18.5 kHz, and the amplitude of the tip of the test piece A: 25 μm, using ion exchange water (room temperature).

Then, after the cavitation erosion test of the above procedure was performed, the amount of weight loss of the test piece A (the amount of cavitation erosion) was measured by an electronic balance (degree of precision: 0.1 mg), and the results are shown in the graph of FIG. 12 and the following Table 3.

A list of respective film forming conditions in the respective working examples and comparative examples is shown in Table 2, and a list of results in respective evaluation tests is shown in Table 3.

TABLE 2

| Test Piece | Film Forming Method | Film Substance Upper Stage: Interlayer Lower Stage: Ceramic Hard Film | Substrate Temperature | Bias Voltage |
| --- | --- | --- | --- | --- |
| Comparative Example 1 | HCD | Cr<br>TiN | 500° C. | 0 V<br>−130 V |
| Comparative Example 2 | AIP | Cr<br>TiN | 530° C. | 0 V<br>−100 V |
| Comparative Example 3 | AIP | Cr<br>TiN | 530° C. | 0 V<br>−70 V |
| Comparative Example 4 | AIP | Cr<br>TiN | 530° C. | 0 V<br>−30 V |

TABLE 3

| Items | No. | PVD Method | Droplet Diameter (μm): Pieces/mm$^2$ (※1) | | | | | Drain Erosion Amount (※2) |
| --- | --- | --- | --- | --- | --- | --- | --- | --- |
| | | | d ≦ 1 | 1 < d ≦ 5 | 5 < d ≦ 10 | d > 10 | All | mg/6 Hr |
| Working Examples | Working Example 1 | HCD | 345 | 413 | 15 | 8 | 781 | 0.05 |
| | Working Example 2 | HCD | 68 | 150 | 38 | 0 | 256 | 0 |
| | Working Example 3 | HCD | 165 | 256 | 23 | 8 | 451 | 0.01 |
| | Working Example 4 | HCD | 534 | 379 | 65 | 15 | 993 | 0.15 |
| Comparative Examples | Comparative Example 1 | HCD (Conventional) | 1,020 | 330 | 30 | 0 | 1,380 | 0.6 |
| | Comparative Example 2 | AIP | 3,511 | 2,383 | 248 | 45 | 6,187 | 0.82 |

TABLE 3-continued

| Items | No. | PVD Method | Droplet Diameter (μm): Pieces/mm² (※1) | | | | | Drain Erosion Amount (※2) |
| | | | d ≤ 1 | 1 < d ≤ 5 | 5 < d ≤ 10 | d > 10 | All | mg/6 Hr |
|---|---|---|---|---|---|---|---|---|
| | Comparative Example 3 | AIP | 2,556 | 1,880 | 113 | 8 | 4,557 | 1.32 |
| | Comparative Example 4 | AIP | 1,857 | 2,692 | 300 | 68 | 4,917 | 1.03 |

HCD: Hollow Cathode Discharge
AIP: Arc Ion Plating
(※1): Number of Droplets at 300 Magnification (Field of View of 0.42 mm * 0.316 mm) of Electron Microscope.
(※2): Amount of Erosion after Cavitation Erosion Test for 6 Hours.

[Evaluation Results]

As shown in Table 3, in the test pieces of Working Examples 1 to 4 in which a ceramic hard film was formed under the conditions specified in the invention, and the particle diameter and density of droplets which exist on the surface of the ceramic hard film were set to the ranges specified in the invention, the average density of the droplets in which the particle diameter in the surface of the ceramic hard film is 1 μm or less was within 550 pieces/mm² (refer to the microscope picture diagram of FIG. 9A). Additionally, it was confirmed that the density of all the droplets in the surface of the ceramic hard film is also within 1000 pieces/mm² in each working example, the amount of cavitation erosion is little, and the drain erosion-proofness is excellent.

In contrast, in the test piece of Comparative Example 1 in which a ceramic hard film was formed under the conventional conditions by using the HCD method similar to Working Examples 1 to 4, and the particle diameter or density of droplets which exist on the surface of the ceramic hard film was set to a value out of the specified range of the invention, the average density of the droplets whose particle diameter is 1 μm is as significantly high as more than 1380 pieces/mm². Thus, the drain erosion-proofness is inferior.

Additionally, although the test pieces of Comparative Examples 2 to 4 were manufactured by forming an interlayer and a hard film on a base material by the time-proven AIP method, the number of droplets are large on the whole, and the drain erosion proofness is largely inferior even in the test pieces of the above Working Examples 1 to 4 (refer to the microscope picture diagram of FIG. 9B).

As described above, it was confirmed that the test pieces of Working Example 1 to 4 have excellent drain erosion-proofness by setting the particle diameter and density in the surface of the ceramic hard film to the ranges specified in the invention, as compared with the test pieces manufactured by the AIP method, which is a conventional well-known method.

It becomes clear from the respective evaluation tests described above that drain erosion is inhibited from occurring under an environment in which a part for a rotary machine related to the invention directly contacts gas, and the drain erosion-proofness is excellent.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A part for a rotary machine, the part comprising:
   a base material; and
   a ceramic hard film formed on a surface of the base material, wherein
   a film thickness of the ceramic hard film is within a range of 5 μm or more and 15 μm or less, and
   a density of droplets which exist in a surface of the ceramic hard film is set to be within 1000 pieces/mm², and a density of droplets whose mean particle diameter is 1 μm or less is set to be within 550 pieces/mm².

2. The part for a rotary machine of claim 1,
   wherein the ceramic hard film is made of at least one of TiN, CrN, TiAlN, TiC, TiCN, and ZrN.

3. The part for a rotary machine according to claim 2, further comprising
   an interlayer formed between the base material and the ceramic hard film.

4. The part for a rotary machine according to claim 1, further comprising
   an interlayer formed between the base material and the ceramic hard film.

5. The part for a rotary machine of claim 4,
   wherein the interlayer is made of Cr or Ti.

6. The part for a rotary machine of claim 4,
   wherein the interlayer is made of CrN or TiN.

7. The part for a rotary machine of claim 4,
   wherein the film thickness of the ceramic hard film is greater than a film thickness of the interlayer, and a total film thickness of the ceramic hard film and the interlayer is within a range of 5 μm or more and 20 μm or less.

8. The part for a rotary machine according to claim 4, wherein
   the interlayer is formed by an ion plating method in which an output from electron rays of a plasma gun is 450 (W/cm²) to 550 (W/cm²) and an electromagnetic output is 80 (W/cm²) to 120 (W/cm²).

9. The part for a rotary machine according to claim 1, wherein
   the ceramic hard film is formed by an ion plating method in which an output from electron rays of a plasma gun is 550 (W/cm²) to 980 (W/cm²) and an electromagnetic output is set to a range of 80 (W/cm²) to 120 (W/cm²).

* * * * *